(12) United States Patent
Pai

(10) Patent No.: US 7,274,042 B2
(45) Date of Patent: Sep. 25, 2007

(54) ELECTROLUMINESCENT DEVICE HAVING ANTI-REFLECTIVE MEMBER

(75) Inventor: Jui-Fen Pai, Nan-Tou (TW)

(73) Assignee: TPO Displays Corp., Chu-Nan (TW)

( * ) Notice: Subject to any disclaimer, the term of this patent is extended or adjusted under 35 U.S.C. 154(b) by 18 days.

(21) Appl. No.: 10/850,569

(22) Filed: May 19, 2004

(65) Prior Publication Data

US 2005/0006652 A1 Jan. 13, 2005

(30) Foreign Application Priority Data

May 19, 2003 (TW) .............................. 92113438 A

(51) Int. Cl.
*H01L 33/00* (2006.01)
(52) U.S. Cl. ........................... 257/98; 257/40; 257/79; 257/99
(58) Field of Classification Search ...................... None
See application file for complete search history.

(56) References Cited

U.S. PATENT DOCUMENTS 6,366,017 B1 * 4/2002 Antoniadis et al. ......... 313/506
6,420,736 B1 * 7/2002 Chen et al. .................... 257/99
6,429,451 B1 8/2002 Hung et al.
6,790,594 B1 * 9/2004 Preuss et al. ............. 430/272.1
2002/0180909 A1 * 12/2002 Lubart et al. ................ 349/113
2003/0067266 A1 4/2003 Kim et al.

FOREIGN PATENT DOCUMENTS

JP 08-008065 A 1/1996
JP 10-162959 A 6/1998

* cited by examiner

*Primary Examiner*—Wai-Sing Louie
(74) *Attorney, Agent, or Firm*—Liu & Liu

(57) ABSTRACT

A light emitting device having an anti-reflective member. The light emitting device includes an anti-reflective member including a reflective layer and a first electrode; a second electrode; and a light emitting layer disposed between the first electrode and the second electrode. The first electrode of the present invention has both electrode and anti-reflective functions. Ambient light is reflected by the first electrode to obtain a first reflected light and reflected by the reflective layer to obtain a second reflected light. The first reflected light and the second reflected light have phase difference; thus, the reflection of ambient light is reduced.

19 Claims, 2 Drawing Sheets

ELECTROLUMINESCENT DEVICE HAVING ANTI-REFLECTIVE MEMBER

BACKGROUND OF THE INVENTION

1. Field of the Invention

The present invention relates to light emitting devices, and more particularly to a light emitting device having reduced reflection of ambient light.

2. Description of the Prior Art

An organic light emitting diode (OLED) (also known as an organic electroluminescent device) is an LED that uses an organic layer as the active layer. In recent years, OLED has been gradually applied in flat panel displays and has many advantages, such as operating at low voltage, with high brightness, light weight and slim profile, full viewing angle, and highly effective contrast ratio.

However, an organic electroluminescent device easily reflects ambient light. This causes inadequate contrast ratio and poor device properties. A frequently used method of increasing the luminance contrast ratio, is adhesion of a polarizer on the light emitting face. However, this method reduces the luminance to only about 30%. In order to achieve the required luminance, the operational voltage must be greatly increased, which, however, shortens the device life.

FIG. 1 is a cross-section view illustrating an example of a conventional electroluminescent device having an anti-reflective member that minimizes reflection of ambient light. Referring to FIG. 1, first, an anti-reflective member 200 is coated on a substrate 100, and then an anode 300, a light emitting layer (EL) 400, and a cathode 500 are sequentially coated. The anti-reflective member 200 includes a reflective metal layer 210, a transparent conductive layer 220, and a thin semi-transparent metal layer 230. Based on the optical interference principle, by selecting a suitable material and thickness of each layer in the anti-reflective member, there is a phase difference between the reflected ambient light L11 by the semi-transparent thin metal layer 230 and the reflected ambient light L12 by the metal reflective layer 210, causing interference between the reflections. Thus, the luminance contrast ratio is increased, while maintaining a luminance higher than 50% of the original luminance.

In U.S. Pat. No. 6,429,451 (Hung et al.), a reflection-reducing layer made of an n-type semiconducting material is disposed between the light-reflective cathode and the electron transporting layer in an organic light emitting device. Thus, ambient light reflection from the cathode is reduced, thus increasing the contrast ratio. Suitable n-type semiconducting material can be ZnO or ZnS.

SUMMARY OF THE INVENTION

The present invention is directed to a novel electroluminescent device having a simplified anti-reflective structure. According to the present invention, the anti-reflection member includes one of the electrodes of the electroluminescent pixel. In one embodiment of the present invention, the electroluminescent device includes an anti-reflective member including a reflective layer and a first electrode; a second electrode; and a light emitting layer disposed between the first electrode and the second electrode. The first electrode is a single layer partially reflecting ambient light in a first phase and partially passing ambient light through to the reflective layer. The reflective layer reflects ambient light pass through by the first electrode. Ambient light is reflected by the first electrode to obtain a first reflected light and reflected by the reflective layer to obtain a second reflected light. The first reflected light and the second reflected light have a phase difference, thus reducing reflection of ambient light.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention is directed to an electroluminscent device having an optical member for minimizing reflection of ambient light. For purpose of illustrating the principles of the present invention and not limitation, the present invention is described by reference to embodiments directed to organic light emitting diodes.

Figure 2:
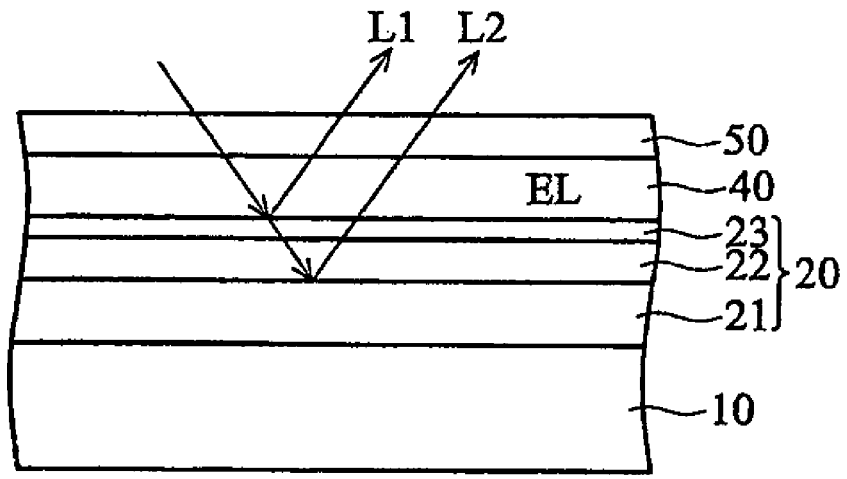
FIG. 2 is a cross-section illustrating an electroluminescent device having an anti-reflective member according to a preferred embodiment of the present invention.

FIG. 2 is a cross-section view illustrating an electroluminescent device 1 having an anti-reflective member according to one embodiment of the present invention. Referring to FIG. 2, the electroluminescent device 1 includes a substrate 10, an anti-reflective member 20 on the substrate 10, a light emitting layer 40 on the anti-reflective member 20, and an electrode 50 on the light emitting layer 40. For the sake of simplicity, FIG. 2 only shows a section of the panel of the electroluminescent device 1. Further, there may be additional elements or components that are not shown in FIG. 2 but which may be present in the electroluminescent device 1.

The feature of the present invention resides in that there is a single layer in the anti-reflective member 20 that simultaneously serves as an electrode Specifically, the anti-reflective member 20 includes a reflective layer 21, a transparent conductive layer 22, and a first electrode 23, all of which can be formed by sputtering or e-gun evaporation.

Utilizing optical interference principles, the layers 21, 22 and 23 are configured to minimize reflection of ambient light. For example, the reflective layer 21 can have a reflectivity higher than 80% and a thickness about between 400 Å and 5000 Å. A suitable reflective layer 21 can be any material having a substantially high reflectivity, such as a metal, for example, Al, Ag, Au, Cr, Mo, or a combination thereof. The transparent conductive layer 22 can have a transmittance higher than 80% and a thickness of about 300 Å to 3000 Å. A suitable material for the transparent conductive layer 22 can be indium tin oxide (ITO), indium zinc oxide (IZO), Al:$SiO_2$, or Cr:$SiO_2$. The first electrode 23 is a single layer that not only serves as an electrode, but also has semi-transparent and semi-reflective properties or transflective properties). In order to have a transflective effect, the first electrode 23 is preferably thinner than layer 22, for example, having a thickness of 50 Å to 1000 Å. The anti-reflective member 20 of the present invention has an optical interference property. When ambient light enters the electroluminescent device of the present invention, a portion of ambient light can be reflected by the first electrode 23 to obtain a first reflected light L1, and a portion of ambient light can pass the underlying transparent conductive layer 22 and then be reflected by the reflective layer 21 to obtain a second reflected light L2. The material and thickness of each layer in the anti-reflective member 20 can be selected based on the optical interference principle of causing a phase difference between the first reflected light L1 and the second reflected light L2. In this way, reflection of ambient light is reduced and luminance contrast ratio is increased. For example, the first reflected light L1 and the second reflected light L2 can be adjusted to have 180 degrees of phase difference. The present invention greatly reduces ambient light reflection. Therefore, there is no need to increase the operational voltage of the device, but the luminance contrast ratio can still be increased. Thus, the life of the electroluminescent device can be lengthened.

Figure 1:
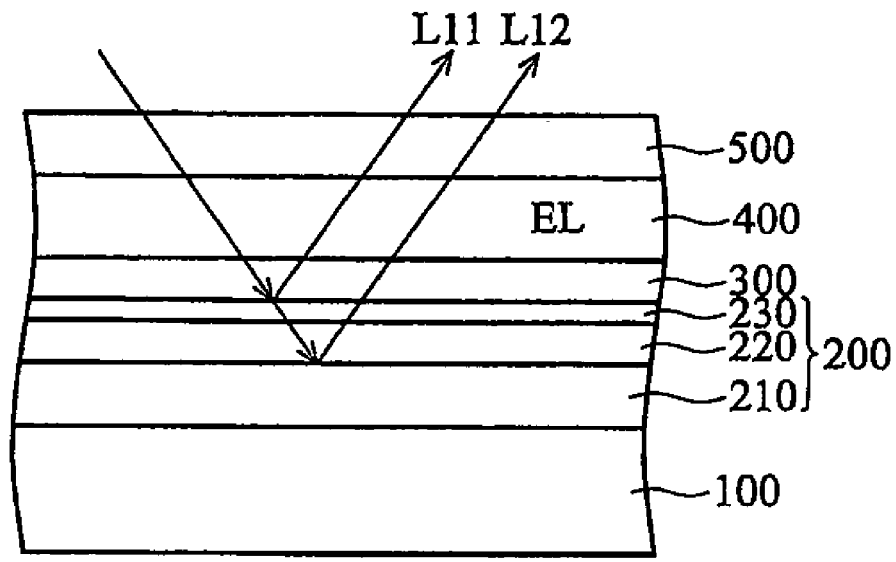
FIG. 1 is a cross-section illustrating a conventional electroluminescent device having an anti-reflective member.

Compared to the conventional electroluminescent device shown in FIG. 1, which uses the optical interference principle to reduce reflection of ambient light, the first electrode of the present invention has both an electrode function and an anti-reflective function. A portion of ambient light is reflected and a portion of ambient light passes through the device. The conventional technique needs to produce one layer of the first electrode and one layer of the transflective layer. In contrast, the present invention only requires production of a single layer of the first electrode with dual functions. Thus, one production course is omitted, saving overall production cost.

The light emitting layer 40 of the present invention can be an inorganic or organic material. When the light emitting layer 40 is an organic material, the electroluminescent device of the present invention is an organic light emitting device (OLED). The first electrode 23 can serve as an anode or cathode, but is not limited to this. When the first electrode 23 is an anode and the second electrode 50 is a cathode, the first electrode 23 preferably has a work function higher than 4.6 eV, for example, between 4.7 eV and 5.0 eV. A suitable first electrode (anode) 23 can be metal such as Al, Cr, Mo, Pt, Ni or Au, or conductive ceramic such as TiN or CrN. A suitable second electrode (cathode) 50 can be LiF/Al or Ca/Al.

When the first electrode 23 is a cathode and the second electrode 50 is an anode, the first electrode 23 preferably has a work function of 2 eV to 3 eV, for example, 2.6 eV to 2.7 eV. A suitable first electrode 23 can be metal such as Ca, Mg, Li, or Al/Li alloy.

Figure 3:
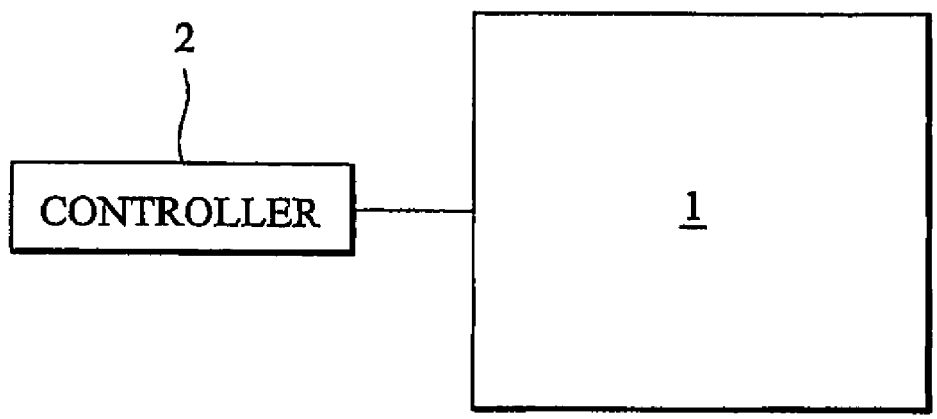
FIG. 3 is a schematic diagram illustrating an electroluminescent display device of the present invention, incorporating a controller.

The electroluminescent device 1 shown in FIG. 2 can be coupled to a controller 2, forming an electroluminescent display device 3 as shown in FIG. 3. The controller 2 can comprise a source and gate driving circuits (not shown) to control the electroluminescent device 1 to render image in accordance with an input. The electroluminescent display device 3 and associated controller 2 may be directed to an OLED type display device.

Figure 4:
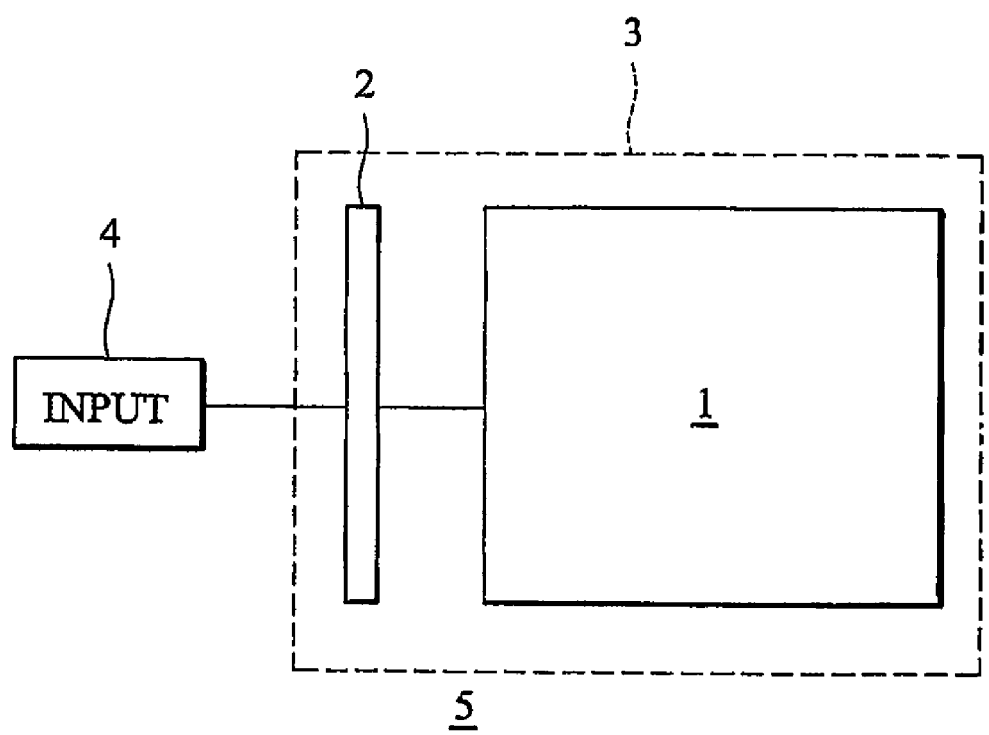
FIG. 4 is a schematic diagram illustrating an electronic device, incorporating the electroluminescent device of the present invention.

FIG. 4 is a schematic diagram illustrating an electronic device 5 incorporating the electroluminescent display device 3 shown in FIG. 3. An input device 4 is coupled to the controller 2 of the electroluminescent display device 3 shown in FIG. 3 to form an electronic device 5. The input device 4 can include a processor or the like to input data to the controller 2 to render an image. The electronic device 5 may be a portable device such as a PDA, notebook computer, tablet computer, cellular phone, or a display monitor device, or non-portable device such as a desktop computer.

In conclusion, the anti-reflective member of the present invention includes a reflective layer and a first electrode, and the first electrode has anti-reflective and electrode functions. The present invention makes the reflected ambient light by the reflective layer and the reflected ambient light by the first electrode have a phase difference based on the optical interference principle. Thus, the reflection of ambient light is reduced and the luminance contrast ratio of the device is increased. Moreover, the present invention only requires production of a single layer of the first electrode with dual functions (anti-reflective and electrode functions). Therefore, one production course is omitted, thus reducing overall production cost.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A light emitting device, comprising:
   an anti-reflective member including a first electrode that serves an electrode and reflects portion of ambient light in a first phase, a reflective layer that reflects ambient light in a second phase different from the first phase, and a transparent conductive layer disposed between the reflective layer and the first electrode, wherein material and thickness of the first electrode, the reflective layer and the transparent conductive layer have a property such that the reflected light in the first and second phases interfere with each other to reduce overall intensity of reflected ambient light;
   a second electrode; and
   a light emitting layer disposed between the first electrode and the second electrode.

2. The light emitting device as claimed in claim 1, wherein the reflective layer comprises metal.

3. The light emitting device as claimed in claim 1, wherein the reflective layer has a reflectivity higher than 80%.

4. The light emitting device as claimed in claim 1, wherein the reflective layer has a thickness of about 400Å to 5000Å.

5. The light-emitting device as claimed in claim 1 wherein the transparent conductive layer has a transmittance higher than 80%.

6. The light-emitting device as claimed in claim 1 wherein the transparent conductive layer has a thickness of about 300Å to 3000Å.

7. The light emitting device as claimed in claim 1, wherein the first electrode has a thickness of about 50Å to 1000Å.

8. The light emitting device as claimed in claim 1, wherein the light emitting layer comprises an organic material.

9. The light emitting device as claimed in claim 8, wherein the first electrode is an anode and the second electrode is a cathode.

10. The light emitting device As claimed in claim 9, wherein the first electrode has a work function higher than 4.6 eV.

11. The light emitting device as claimed in claim 10, wherein the first electrode comprises a metal or a conductive ceramic.

12. The light emitting device as claimed in claim 11, wherein the first electrode comprises Al, Cr, Mo, Pt, Ni, Au, or a combination thereof.

13. The light emitting device as claimed in claim 11, wherein the first electrode comprises TiN or CrN.

14. The light emitting device as claimed in claim 8, wherein the first electrode is a cathode and the second electrode is an anode.

15. The light emitting device as claimed in claim 14, wherein the first electrode has a work function of 2 eV to 3 eV.

16. The light emitting device as claimed in claim 15, wherein the first electrode comprises a metal.

17. The light emitting device as claimed in claim 16, wherein the first electrode comprises Ca, Mg, Li, Al, Al/Li alloy or a combination thereof.

18. A light emitting display device, comprising:
a light emitting device as in claim 1; and
a controller coupled to the light emitting device to control the light emitting device to render an image in accordance with an input.

19. An electronic device, comprising:
a light emitting display device of claim 18; and
an input device coupled to the controller of the light emitting display device to control the light emitting display device to render an image.

* * * * *